United States Patent
Leal et al.

(10) Patent No.: US 8,349,666 B1
(45) Date of Patent: Jan. 8, 2013

(54) FUSED BUSS FOR PLATING FEATURES ON A SEMICONDUCTOR DIE

(75) Inventors: George R. Leal, Cedar Park, TX (US); Kevin J. Hess, Austin, TX (US); Trent S. Uehling, New Braunfels, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/189,054

(22) Filed: Jul. 22, 2011

(51) Int. Cl.
*H01L 21/82* (2006.01)
*H01L 21/332* (2006.01)
*H01L 21/44* (2006.01)
*H01L 21/4763* (2006.01)

(52) U.S. Cl. ........ 438/132; 438/140; 438/601; 438/618; 257/E21.59; 257/E29.012; 257/E29.013; 257/E23.149; 257/E21.592

(58) Field of Classification Search ................ 438/132, 438/140, 601, 618, FOR. 144, FOR. 433; 257/127, 170, 181, 409, 457, 459, 484, 688, 257/E21.59, E29.012, E29.013, E23.149, 257/E21.592
See application file for complete search history.

(56) References Cited

U.S. PATENT DOCUMENTS

| | | | |
|---|---|---|---|
| 5,813,881 | A | 9/1998 | Nathan et al. |
| 6,222,212 | B1 | 4/2001 | Lee et al. |
| 6,350,633 | B1 | 2/2002 | Lin |
| 6,911,360 | B2 | 6/2005 | Li et al. |
| 7,575,958 | B2 | 8/2009 | Hoefler et al. |
| 8,242,576 | B2 * | 8/2012 | Lin et al. ........ 257/529 |
| 2010/0001405 | A1 * | 1/2010 | Williamson et al. ........ 257/774 |
| 2010/0025824 | A1 * | 2/2010 | Chen et al. ........ 257/620 |

* cited by examiner

*Primary Examiner* — Michelle Mandala
(74) *Attorney, Agent, or Firm* — Mary Jo Bertani; Joanna G. Chiu (57) ABSTRACT

A method for forming a semiconductor structure includes forming a plurality of fuses over a semiconductor substrate; forming a plurality of interconnect layers over the semiconductor substrate and a plurality of interconnect pads at a top surface of the plurality of interconnect layers; and forming a seal ring, wherein the seal ring surrounds active circuitry formed in and on the semiconductor substrate, the plurality of interconnect pads, and the plurality of fuses, wherein each fuse of the plurality of fuses is electrically connected to a corresponding interconnect pad of the plurality of interconnect pads and the seal ring, and wherein when each fuse of the plurality of fuses is in a conductive state, the fuse electrically connects the corresponding interconnect pad to the seal ring.

11 Claims, 11 Drawing Sheets

SECTION A - A

FIG. 1

DETAIL B

FIG. 2

SECTION A-A
FIG. 3

SECTION A - A
FIG. 4

SECTION A - A
FIG. 5

SECTION A-A
FIG. 6

SECTION A-A
FIG. 7

SECTION A-A
FIG. 8

SECTION A-A
FIG. 9

SECTION A - A
FIG. 10

SECTION A - A
FIG. 11

FUSED BUSS FOR PLATING FEATURES ON A SEMICONDUCTOR DIE

BACKGROUND

1. Field of the Invention

This invention relates in general to semiconductor devices and more specifically to electroplating interconnect pads for semiconductor devices.

2. Description of the Related Art

To electroplate features such as interconnect or bond pads on a semiconductor wafer, plating buses must be added to the top surface of the wafer and then removed after the plating process is complete. The application and removal of the buses add cost.

A replacement for Au—Al wirebonding has been sought. The Over Pad Metallurgy (OPM) process for bond pads was developed to enable Au—Au and Cu—Au bonding. The OPM deposition is currently limited to electroless plating processes because a method for connecting the individual bond pads to a plating bus has not been conceived and traditional pattern (electro) plating processes are cost prohibitive.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The features shown in the Figures are not necessarily drawn to scale.

DETAILED DESCRIPTION

The following sets forth a detailed description of a mode for carrying out the invention. The description is intended to be illustrative of the invention and should not be taken to be limiting.

Embodiments of a fused plating bus connection between a seal ring or other continuous die or wafer structure and the individual bond pads on the top surface of the die are disclosed. One embodiment comprises a polysilicon fuse at the active layer of the wafer proximal to the seal ring structure. The contacts of the seal ring are directly connected to the first end of the poly fuse. A metal/via stack electrically coupled to the topmost pad conductive layer is connected to the second end of the fuse link. The metal/via stack can be placed between the bond pad footprint and the seal ring or directly under the bond pad. Seal rings of multiple die on the wafer may be grouped together via an electrical connection to a common metal tracing placed in the scribe street that is later removed during the sawing process.

The current for plating flows through the common metal trace in the scribe street, the seal ring, poly fuse, metal stack, and to the bond pad. Once the plating process is completed, the fuse can be blown by overdriving the fuse with a current higher than that used for the plating process. Thus, bond pads can be electrolytically plated and then isolated from the plating bus. The fuse overdriving process can be performed during wafer probe test where the fuse blowing process can be staged or sequenced to further limit total current needed.

Figure 1:
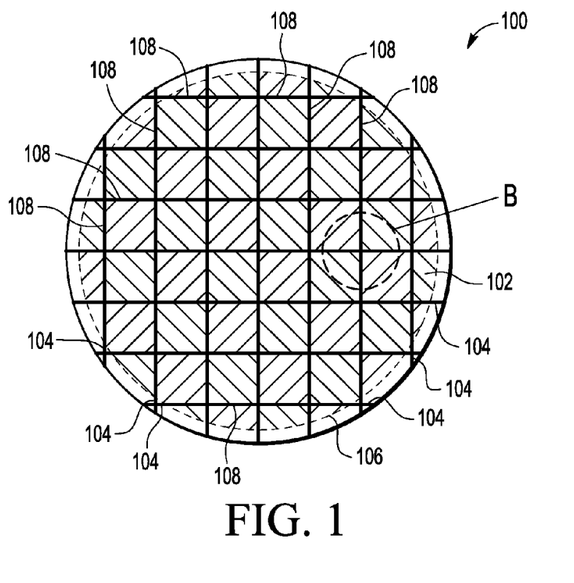
FIG. 1 illustrates a top view of an embodiment of semiconductor wafer.
Figure 2:
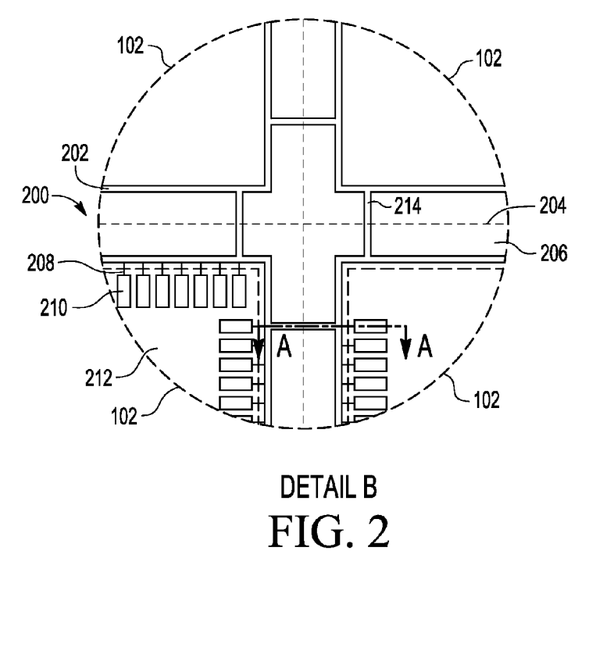
FIG. 2 is a partial top view of additional detail of the wafer of FIG. 1 according to an embodiment.

FIG. 1 illustrates a top view of an embodiment of semiconductor wafer 100 with a plurality of integrated circuit (IC) die 102 formed thereon. IC die 102 are shown cross-hatched in FIG. 1 to distinguish IC die 102 from unused portions of around the circular edge of wafer 100. Plating traces 104 are connected to seal rings 108 formed around the edge of each IC die 102 in a grid pattern on wafer 100. The end of each trace 104 can extend into and beyond edge bead region 106 to the edge of wafer 100. Metal interconnect layers in the edge bead region 106 can be exposed by selectively removing dielectric material using processes and tools known in the art. Referring to FIG. 2, a partial top view of additional detail of a portion delineated by area B of wafer 100 in FIG. 1 according to an embodiment is shows corner portions at an intersection of four IC dies 102 having seal rings 202, singulation path 204, scribe streets 206, fuses 208, interconnect pads 210, active regions 212, and seal ring interconnects 214.

Seal rings 202 are placed around the perimeter of IC dies 102 to seal the edge of IC dies 102 from contaminating ions that affect the yield during processing and affect performance of IC die 102 after IC die 102 has been fabricated. In addition, seal ring 202 is grounded to a substrate (not shown) of wafer 200. In another embodiment, the seal ring 202 is connected to the substrate through a well implant (not shown). Singulation paths 204 are shown by dashed lines in scribe streets 206 to indicate the location where a saw and/or laser may be used to separate IC die 102 from one another.

Active regions 212 of IC die 102 are delineated by a dashed line inside the perimeter of seal ring 202 and include circuitry (not shown) that is used for the functionality of a semiconductor device. For example, active regions 212 may include circuitry used for logic or memory functions. Interconnect pads 210 are coupled to the circuitry in active regions 212 and are typically arranged in one or more rows around the inside perimeter of active regions 212. Each of fuses 208 are coupled between a corresponding interconnect pad 210 and seal ring 202. One end of each seal ring interconnect 214 is coupled to a first seal ring 202 and another end of seal ring interconnect 214 is coupled to another seal ring 202 across scribe street 206. Seal rings 202 are thus interconnected with one another either directly or indirectly by seal ring interconnects 214.

Figure 3:
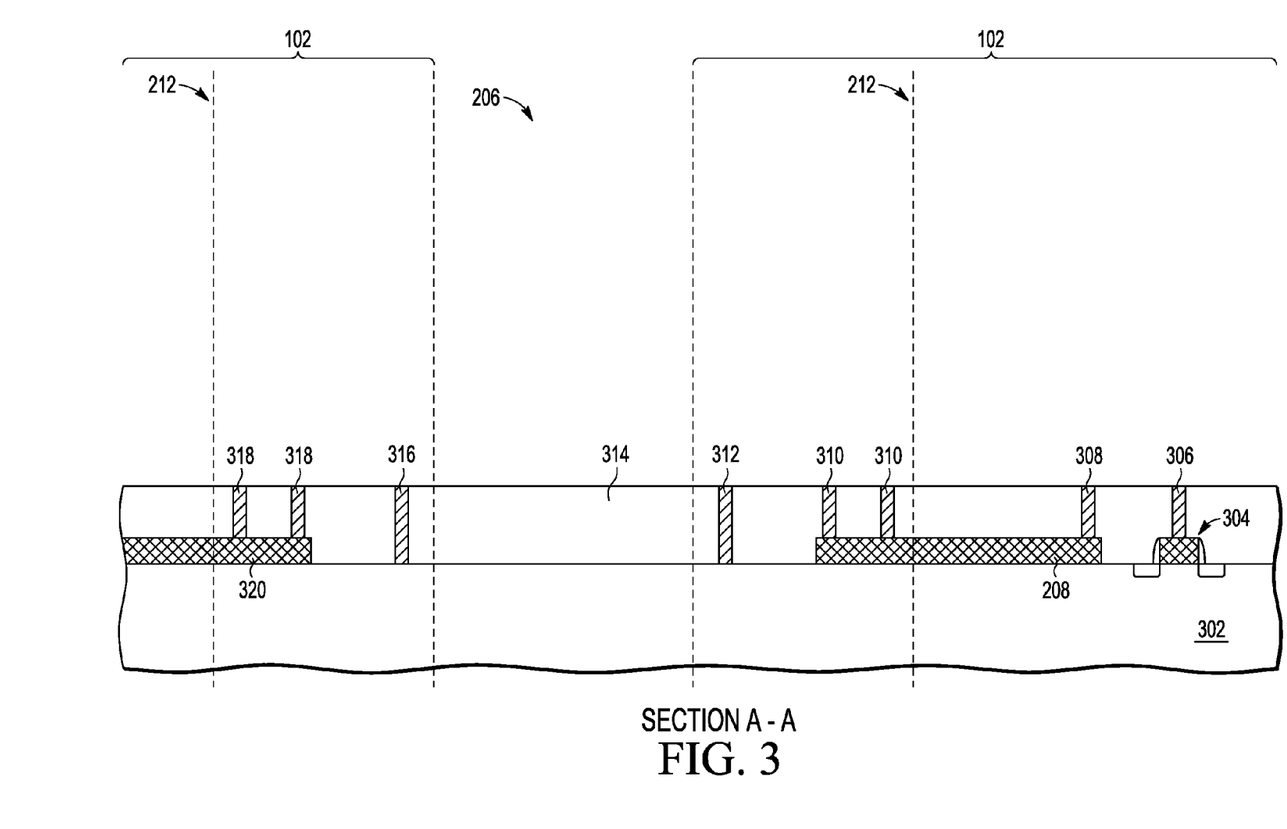
FIG. 3 is a partial side cross-sectional view of a wafer after a phase of manufacture in accordance with an embodiment of the present invention.

FIG. 3 is a partial side cross-sectional view of wafer 200 after a phase of manufacture in accordance with an embodiment of the present invention. Scribe street 206 and first and second active regions 212 are delineated by vertical dashed lines. Wafer 200 includes dielectric layer 314 formed over substrate 302, transistor having a gate electrode 304 and contact 306, and fuses 208, 320. Electrical interconnections including gate contact 306, conductive vias 308, 310, 312, 316, 318 are formed though dielectric layer 314 to corresponding components as further describe herein. Gate electrode 304 is shown as an example of one of various types of active circuitry that may be included in active regions 212. Substrate 302 can be any suitable silicon or silicon-on-insulator (SOI) substrate, such as bulk silicon substrate, a gallium arsenide substrate, or the like, having an active region 212.

A first end portion of fuses 208, 320 are positioned in respective active regions 212 and a second end portion of fuses 208, 320 are positioned between respective active regions 212 and scribe street 206. Via 308 is coupled to fuse 208 inside first active region 212, while a pair of vias 310 are coupled to fuse 208 between first active region 212 and scribe street 206. Another via (not shown) is coupled to fuse 320 inside second active region 212, while a pair of vias 318 are coupled to fuse 320 between second active region 212 and scribe street 206. As additional layers are formed on substrate 302, vias 310 will form part of first seal ring 202 (FIG. 2) and via 312 will form part of a crack stop for first IC die 102. Similarly, vias 318 will form part of second seal ring 202 (FIG. 2) and another via 316 will form part of a crack stop for second IC die 102.

Figure 4:
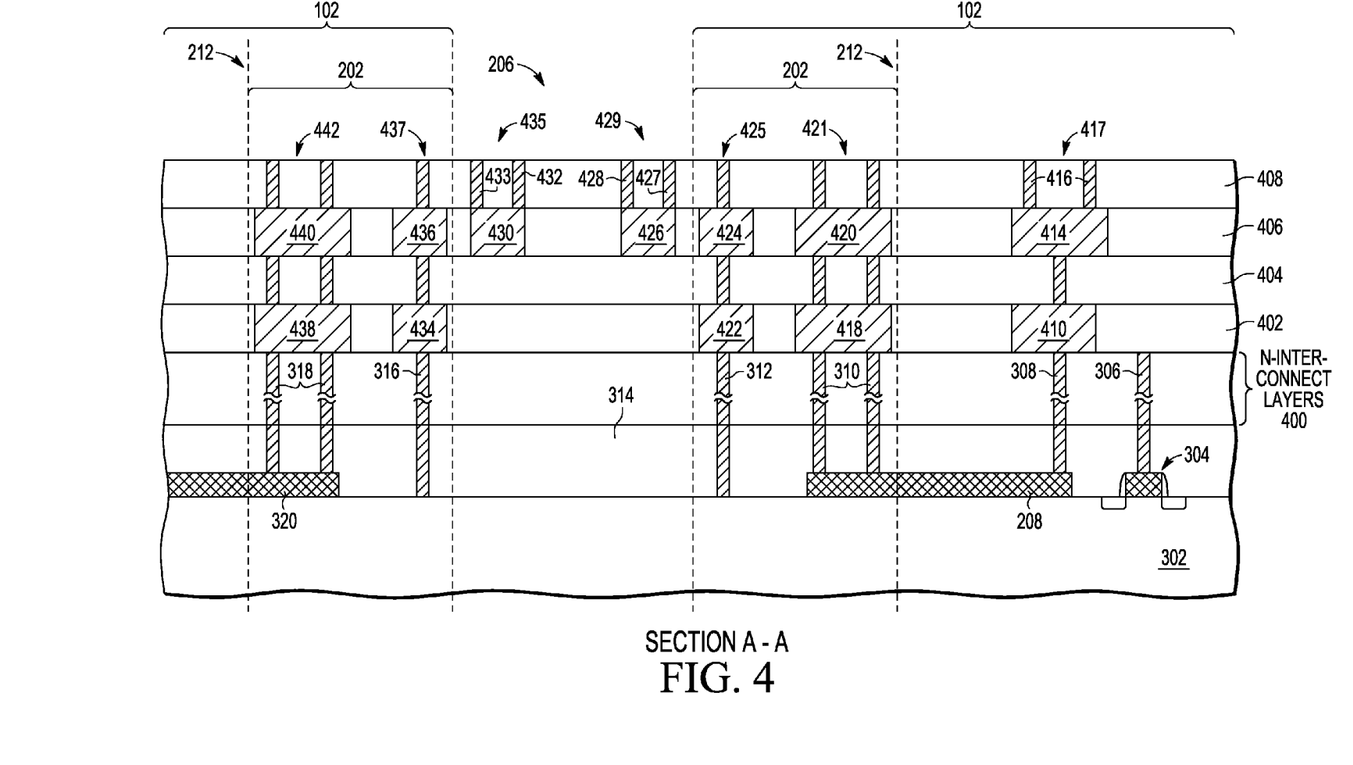
FIG. 4 is a partial side view of the wafer of FIG. 3 after several other phases of manufacture.

FIG. 4 is a partial side view of the wafer of FIG. 3 after several other phases of manufacture including forming a number (N) of interconnect layers 400, which are not shown in detail in FIG. 4, but include alternating metal interconnect layers and via layers that may be similar to metal interconnect layer 402 and via layer 404. In one embodiment, conductive portions of metal interconnect and via layers include copper. In another embodiment, the conductive portions of metal interconnect layers include aluminum and conductive portions of via layers include tungsten. Any number of vias may be formed between conductive portions of adjacent metal interconnect layers.

Stacked vias 306, 308, 310, 312, 316, 318 are formed vertically through dielectric layers in interconnect layers 400, as well as in via layers 404, 408. In the embodiment shown, layer 402 includes metal interconnect 410 coupled to stacked via 308 in active region 212. In the region between active region 212 and scribe street 206, layer 402 further includes metal interconnect 418 coupled to a pair of stacked vias 310; metal interconnect 422 coupled to via stack 312; metal interconnect 434 coupled to stacked via 316; and metal interconnect 438 coupled to a pair of stacked vias 318.

Layer 406 includes metal interconnect 414 coupled to stacked via 308 in active region 212. In the region between active region 212 and scribe street 206, layer 406 further includes metal interconnect 420 coupled to stacked via 310; metal interconnect 424 coupled to stacked via 312; metal interconnect 436 coupled to stacked via 316; and metal interconnect 440 coupled to a pair of stacked vias 318.

Additionally, layer 406 includes first and second metal interconnects 426, 430 in scribe street 206. Layer 408 includes vias 427, 428, 432, 433 coupled to respective metal interconnects 426, 430 in layer 406. Metal interconnect 426 and vias 427, 428 form a first scribe street contact 429 for seal ring interconnect 214 (FIG. 2). Metal interconnect 430 and vias 432, 433 form a second scribe street contact 435 for seal ring interconnect 214.

Plating bus portion 417 is thus formed in active region 212 by stacked vias 308 coupled between fuse 208, metal interconnects 410, 414, and a pair of vias 416 coupled to metal interconnect 414. Plating bus portion 417 couples interconnect pad 210 (FIG. 2) to the first end portion of fuse 208 in active region 212. Additional plating bus portions 417 are formed in active region 212 for other interconnect pads of IC die 102, but are not shown in the figures. Further, plating bus portions 417 are formed in active regions 212 for other IC die 102, but are not shown in the figures.

First edge seal 421 is formed in the region between first active region 212 and scribe street 206 by the pair of stacked vias 310 connected to fuse 208 in layer 314 and extending through layers 400, 404, 408. The pair of stacked vias 310 are further connected to metal interconnects 418, 420 in respective layers 402, 406.

First crack stop 425 is thus formed in the region between edge seal 421 and scribe street 206 by stacked via 312 extending from the bottom of dielectric layer 314 to the top of dielectric layer 408 and coupled to metal interconnects 422, 424 in respective conductive layers 402, 406.

Second edge seal 442 is thus formed in the region between second active region 212 and scribe street 206 by the pair of stacked vias 318 connected to fuse 320 in dielectric layer 314 extending through layers 400, 404, 408. The pair of stacked vias 318 are further connected to metal interconnects 438, 440 in respective layers 402, 406.

Second crack stop 437 is thus formed in the region between edge seal 442 and scribe street 206 by stacked via 316 extending from the bottom of dielectric layer 314 to the top of dielectric layer 408 and coupled to metal interconnects 434, 436 in respective conductive layers 402, 406.

Seal rings 202 surround the periphery of respective active regions 212 and can include a respective edge seal 421, 442 and, optionally, crack stop 425, 437. Although example seal rings 202 for two adjacent IC die 102 on wafer 100 have been described, additional seal rings 202 are formed around the periphery of IC die 102 to prevent moisture from penetrating into active regions 212 of respective IC dies 102 as well as to provide conductive interconnects to fuses 208 and 320. Additional crack stops 425, 437 may be formed to prevent cracks created when respective IC dies 102 are singulated (e.g., by a saw or laser) from penetrating into active regions 212.

Figure 5:
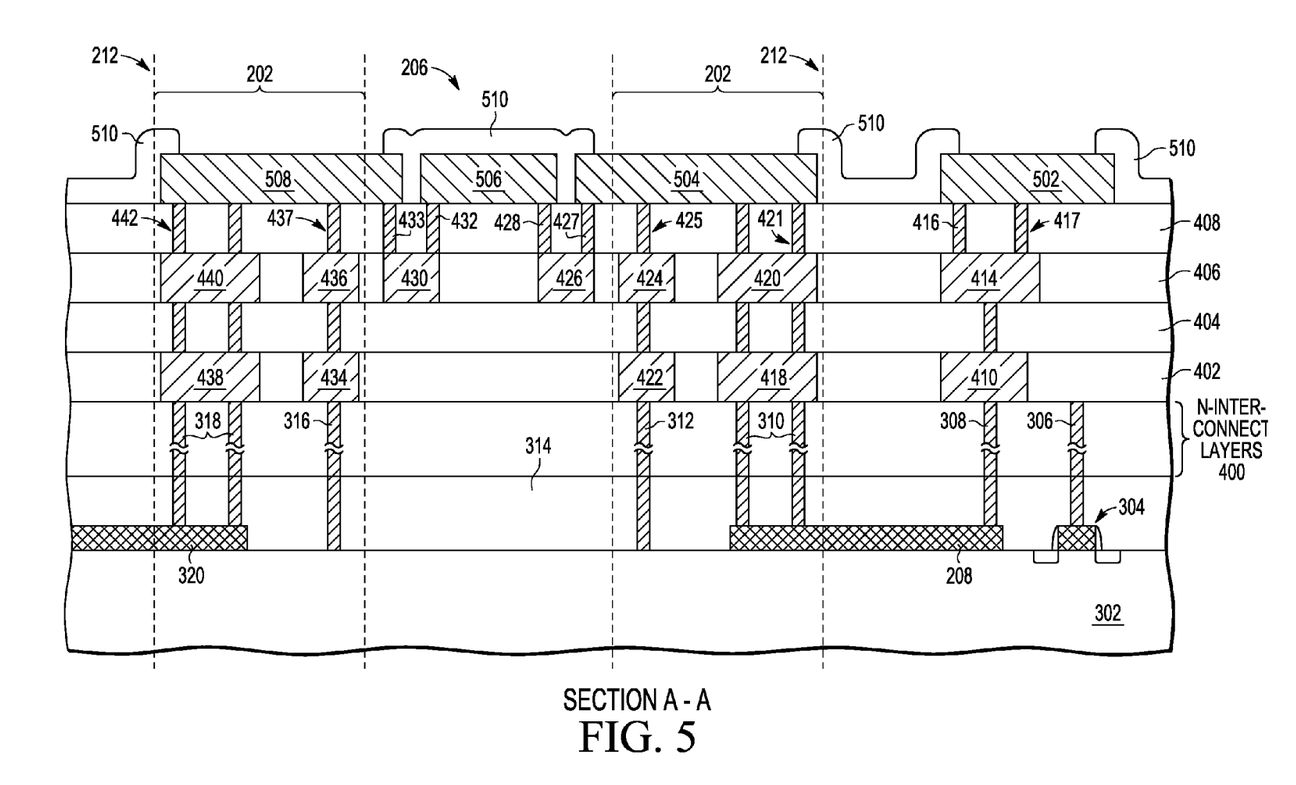
FIG. 5 is a partial side view of the wafer of FIG. 4 after another phase of manufacture.

FIG. 5 is a partial side view of the wafer of FIG. 4 after another phase of manufacture during which conductive interconnect pad 502 is formed in active region 212 over vias 416 of plating bus portion 417. During the same process, plating bus contacts 504, 508 are formed over respective seal rings 202 and vias 427, 433; and seal ring interconnect 506 is formed over vias 428 and 432, thereby conductively interconnecting seal rings 202, fuses 208, 320, plating bus portions 417, and interconnect pad 502.

Passivation layer 510 is then formed over dielectric layer 408 and interconnect pad 502, plating bus contacts 504, 508, and seal ring interconnect 506. Passivation layer 510 is removed over portions of interconnect pad 502 and plating bus contacts 504, 508, but is left over seal ring interconnect 506.

Figure 6:
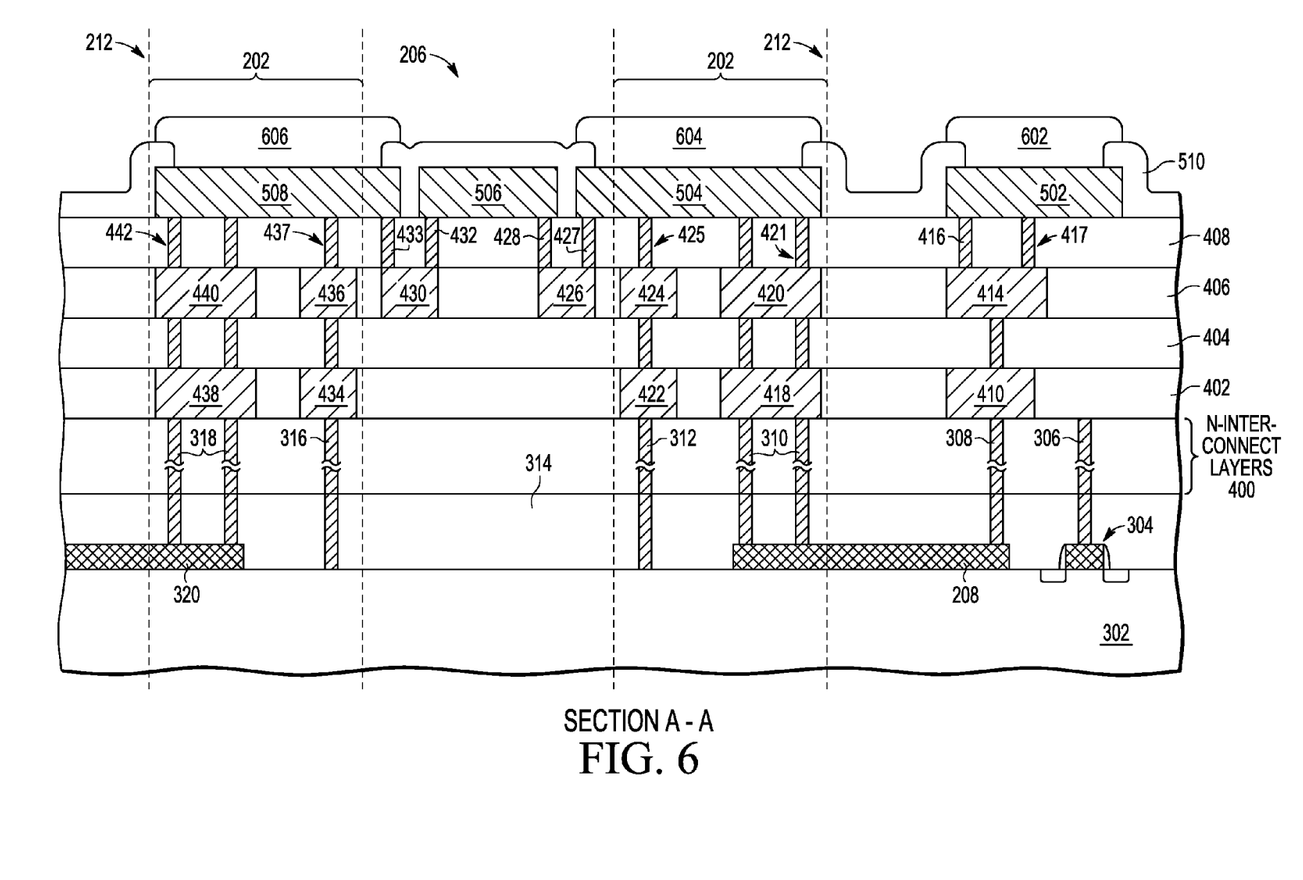
FIG. 6 is a partial side view of the wafer of FIG. 5 after another phase of manufacture.

FIG. 6 is a partial side view of the wafer of FIG. 5 after another phase of manufacture in which conductive layers 602, 604, 606 are formed or electroplated on interconnect pad 502 and plating bus contacts 504, 508 using conventional electroplating methods. In some embodiments, conductive layers 602, 604, 606 are formed by electroplating interconnect pad 502 and plating bus contacts 504, 508. A potential is applied to seal rings 202 (also referred to as traces 104 in FIG. 1) to provide the required electric current for the electroplating process. The electroplating process can be used to plate metals such as Ni, Ni—Au, Ni—Pd—Au, Cu, Cu—Pd or other metals in various embodiments. A metal ring for contacting the electroplating tooling can be formed in the wafer fab process using commonly practiced wafer edge processing methods known to one skilled in the art. Interconnect pad 502 and seal rings 202 are electrically coupled. The current used during the electroplating process is less than the current required to overload fuses 208, 320. For example, for 90 nm CMOS technology, current in the range of 2 to 10 microAmps can be used during electroplating a single contact pad whereas a current in the range of 40-150 milliAmps is required to blow fuses 208, 320.

Figure 7:
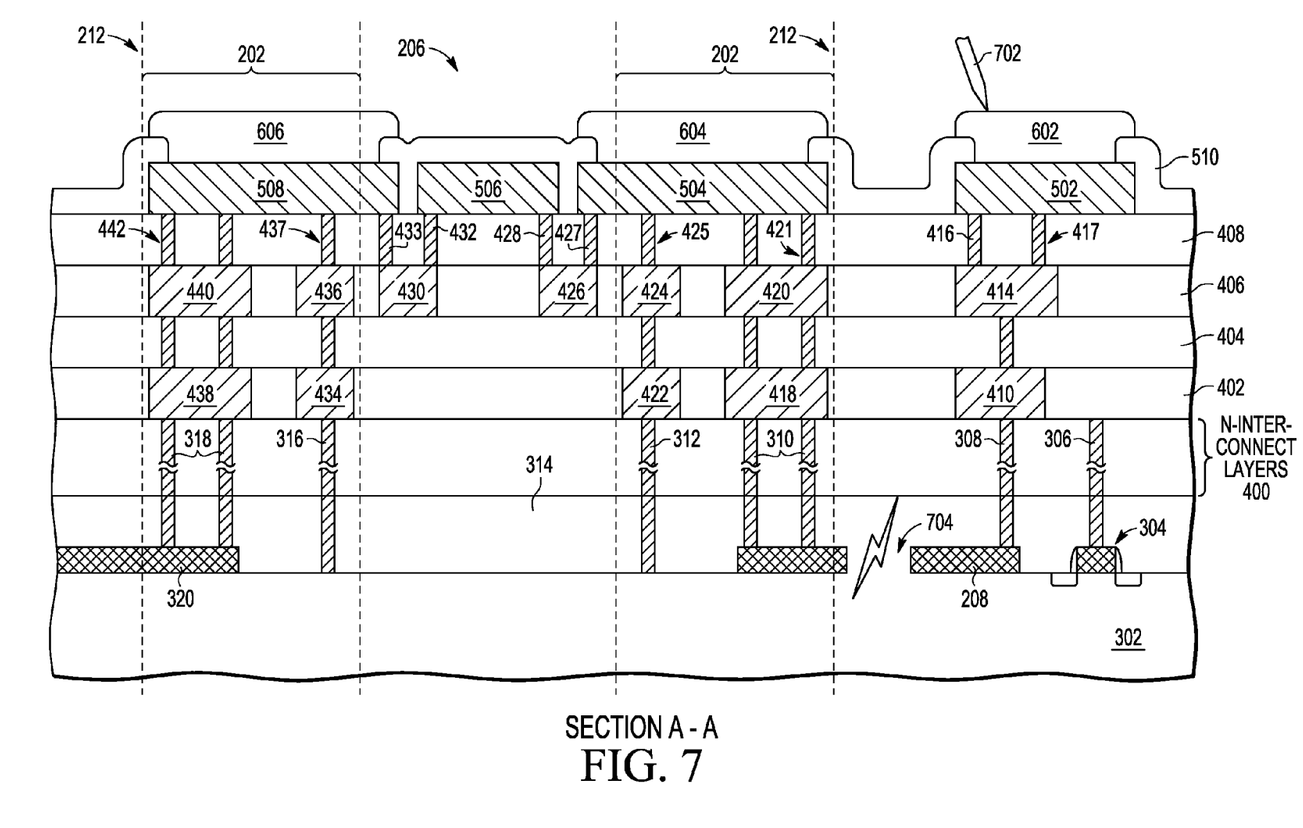
FIG. 7 is a partial side view of the wafer of FIG. 6 after another phase of manufacture.

FIG. 7 is a partial side view of the wafer of FIG. 6 after another phase of manufacture in which current is supplied to interconnect pad 502 through test probe 702 which contacts conductive layer 602. A ground connection to enable current flow through fuse 208 can be made by contacting conductive layer 604 in the seal ring 202. The current is greater than the current required to overload fuse 208, thus causing fuse 208 to fail and create an open circuit 704 between circuitry in active region 212 and seal ring 202. For example, for 45 nm CMOS technology, a fuse with body dimensions of 0.15 um width and 1.0 um length can be overloaded by 100 milliAmps of current applied by a 5 microsecond pulse at 1.5 Volts.

Figure 8:
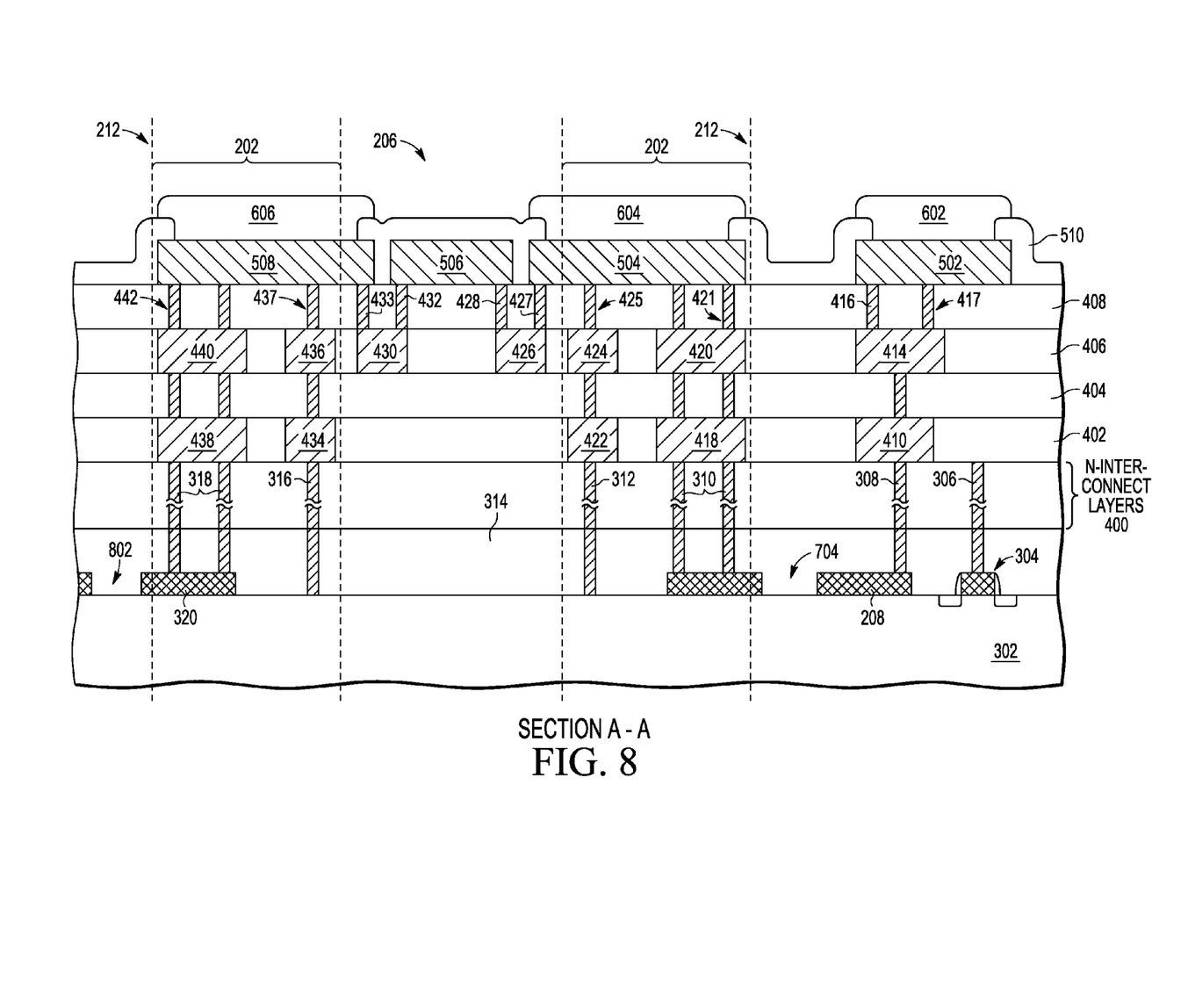
FIG. 8 is a partial side view of the wafer of FIG. 7 after another phase of manufacture.

FIG. 8 is a partial side view of the wafer of FIG. 7 after another phase of manufacture during which overload current was applied to an interconnect pad (not shown) connected to fuse 320. The failure of fuse 320 creates an open circuit 802 between circuitry in respective active region 212 and seal ring 202.

Overload current can be applied to each interconnect pad 502 in sequence via a respective conductive layer 602. The amount of current required to overload fuses 208, 320 is less than the current required to damage active circuitry on IC die 102.

Figure 9:
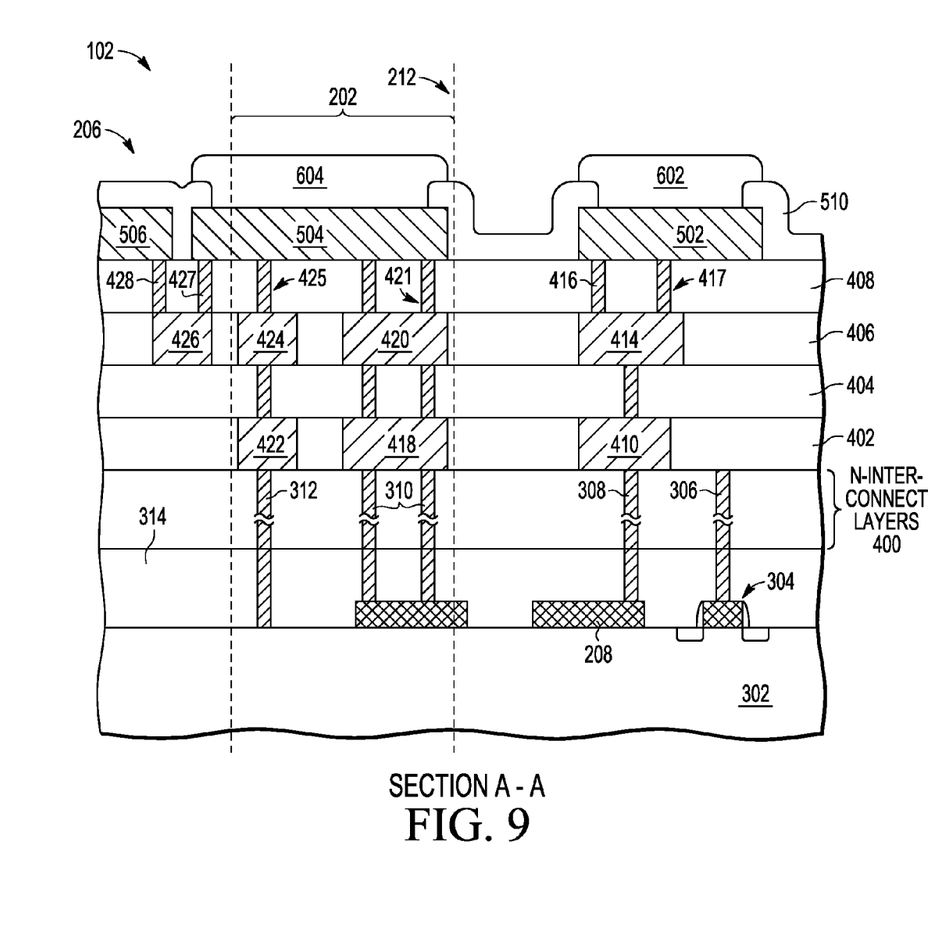
FIG. 9 is a partial side view of the wafer of FIG. 8 after another phase of manufacture.

FIG. 9 is a partial side view of the wafer of FIG. 8 after another phase of manufacture after which IC die 102 have been singulated and are ready to package including attaching IC die 102 to a lead frame or other package substrate (not shown), adding wire bonds between conductive layer 602 and conductive leads on the lead frame or other package substrate, and encapsulating IC die 102 in a protective coating, for example.

Figure 10:
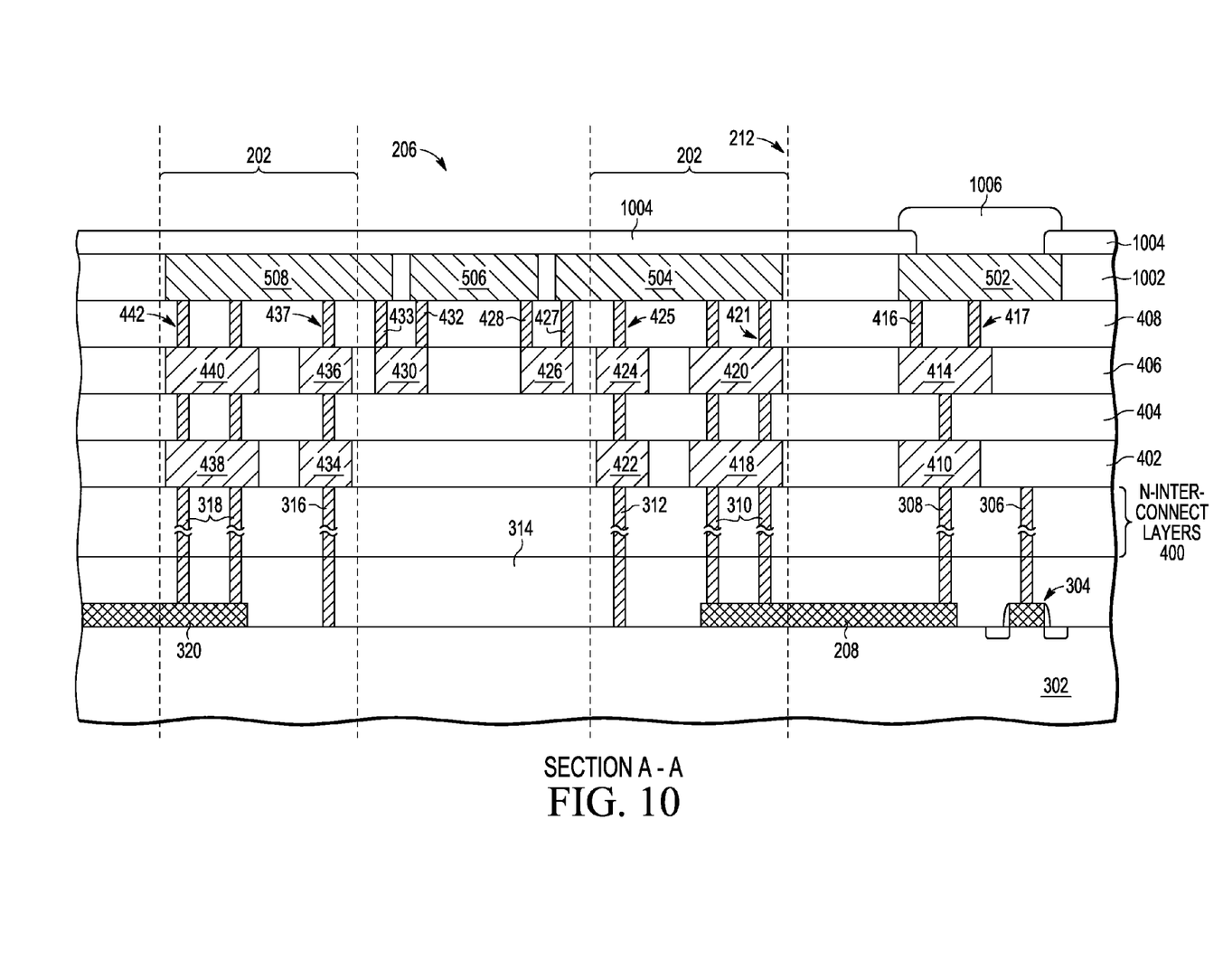
FIG. 10 is a partial cross-sectional side view of another embodiment the wafer of FIG. 4 after another phase of manufacture.

FIG. 10 is a partial cross-sectional side view of another embodiment of the wafer of FIG. 6 after another phase of manufacture during which conductive interconnect pad 502 is formed in active region 212 over vias 416 of plating bus portion 417. During the same process, plating bus contacts 504, 508 are formed over respective seal rings 202 and vias 427, 433; and seal ring interconnect 506 is formed over vias 428 and 432, thereby conductively interconnecting seal rings 202, fuses 208, 320, plating bus portions 417, and interconnect pad 502.

Passivation layer 1004 is then formed over dielectric layer 408 and metal interconnect layer 1002 including interconnect pad 502, plating bus contacts 504, 508, and seal ring interconnect 506. Passivation layer 1004 is removed over a portion of interconnect pad 502 but is left over plating bus contacts 504, 508, and seal ring interconnect 506. Thus, the surface of seal ring interconnect 506 is not exposed during the plating process. The advantage of not plating metal onto the surface of seal ring interconnect 506 is that no additional metal is formed in the scribe street. Metal in the scribe street can cause damage to the die during the wafer sawing process.

A conductive layer 1006 can then be formed on interconnect pad 502 by electroplating interconnect pad 502. Direct potential is applied to seal rings 202 to provide the required electric current for the electroplating process. The interconnect pad 502 is electrically coupled to the seal rings 202. The current used during the electroplating process is less than the current required to overload fuses 208, 320.

Once the electroplating process is complete, current is applied to interconnect pad 502 through a wafer test probe, such as probe 702 (FIG. 7) which contacts conductive layer 1006, as well as to other interconnect pads (not shown). The current is applied to the interconnect pads in a sequence such that the maximum instantaneous current applied to the wafer can be controlled. A current greater than the current required to overload fuse 208 is applied to cause fuse 208 to fail and create an open circuit between circuitry in active region 212 and seal ring 202. A ground connection to enable current flow through fuse 208 can be made by contacting conductive layer 1006 of another interconnect pad electrically coupled to seal ring 202 that is not coupled to the seal ring through an intervening fuse 208. The testing and subsequent induced fuse failure processes are repeated for each interconnect pad/fuse combination for each die 102. IC die 102 can then be singulated and packaged as previously described.

Figure 11:
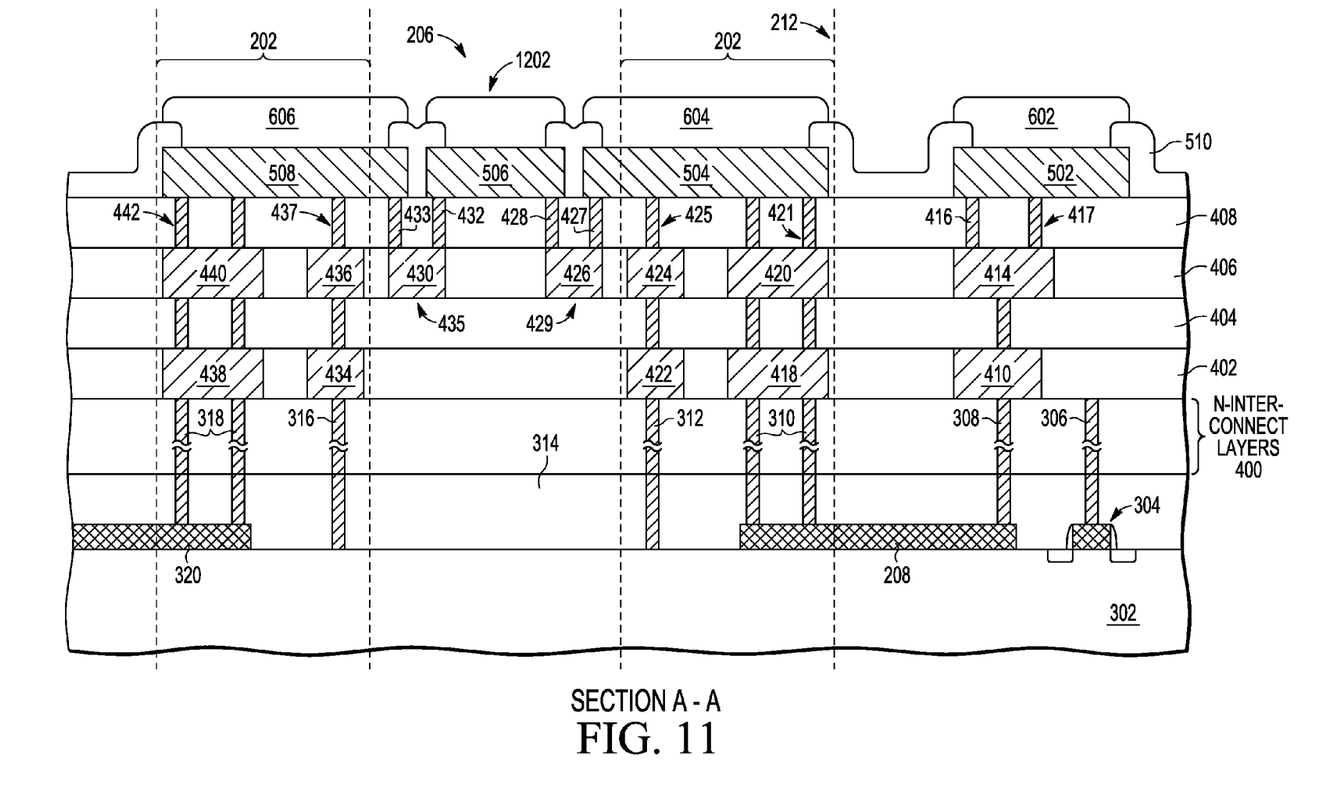
FIG. 11 is a partial cross-sectional side view of another embodiment the wafer of FIG. 4 after another phase of manufacture.

FIG. 11 is a partial cross-sectional side view of another embodiment of the wafer of FIG. 6 after an electroplating phase of manufacture during which metal interconnect 602 is formed over interconnect pad 502, metal interconnects 604, 606 are formed over plating bus contacts 504, 508, and scribe street plating buss contact 1202 is formed over seal ring interconnect 506.

Figure 12:
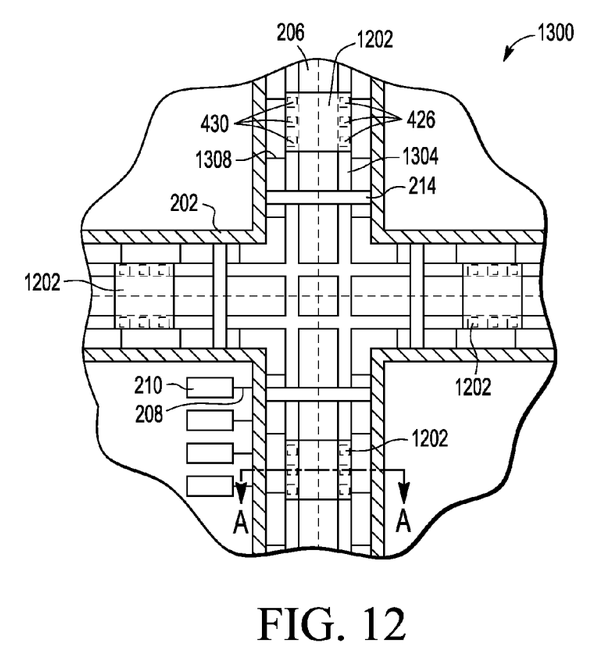
FIG. 12 is a partial top view of the wafer of FIG. 11 after another phase of manufacture.

FIG. 12 is a partial top view of the wafer of FIG. 1 showing scribe street plating buss contacts 1202 spaced at intervals along continuous seal rings 202. Plating buss contacts 1202 provide a plurality of contacts for applying the plating current uniformly across the wafer during the electroplating process.

Once the electroplating process is complete, a current greater than the current required to overload fuse 208 is applied to conductive layer 602 via wafer test probe, such as probe 702 of FIG. 7, as well as to other interconnect pads (not shown) in a sequence such that the maximum instantaneous current applied to the wafer can be controlled. A ground connection to scribe street plating buss contact 1202 can be made to enable current flow through fuse 208. The testing and subsequent induced fuse failure processes are repeated for each interconnect pad/fuse combination for each die 102. IC die 102 can then be singulated and packaged as specified.

Figure 13:
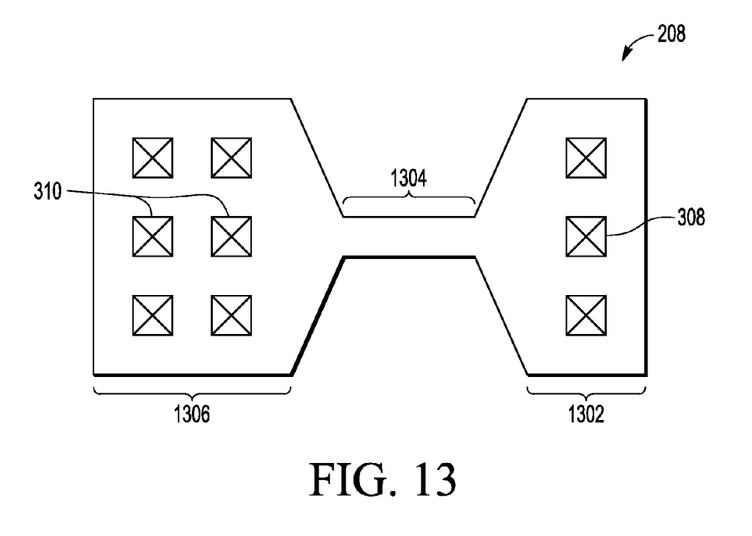
FIG. 13 illustrates a top-down layout schematic view of an embodiment of a fuse that can be used in the wafer of FIGS. 2-12.

FIG. 13 illustrates a top-down layout view of an embodiment of fuse 208 that can be used in the wafer of FIGS. 2-12. Fuse 208 includes first end portion 1302, center portion 1304, and second end portion 1306. Center portion 1304 has a narrower cross-section than end portions 1302, 1306. First and second end portions 1302, 1306 include respective contacts 308, 310 to provide an electrical connection between interconnect pad plating buss portion 417 and edge seal plating buss portion 421 (FIG. 4). Note that although six contacts 310 and three contacts 308 are shown to form each electrical connection, any number and shape of contacts can be used to provide the electrical connections. For example, in another embodiment, the electrical connections to the one or more end portions may be made by bar contacts. Fuse 208 is blown by driving a high enough current through it to result in fuse 208 being changed to a nonconductive state, thereby eliminating the electrical connection between end portions 1302, 1306.

By now it should be appreciated that there has been provided methods and structures for forming and using polysilicon fuses 208, 320 coupled to seal rings 202 and interconnect pads 502-508 as electroplating busses for semiconductor devices. One end of fuses 208, 320 is coupled to respective edge seals 421, 442 and another end of fuses 208, 320 is coupled to respective interconnect pads 502. In one embodiment, one end of fuses 208, 320 is located under respective edge seals 421, 442 and another end of fuses 208, 320 is located under respective interconnect pads 502. The addition of fuses 208, 320 therefore should not affect the size of IC die 102. In another embodiment, one end of the fuses 208, 320 is coupled to respective edge seals 421, 442 but not located below the seal ring 202. In still another embodiment, another end of fuses 208, 320 is coupled to the respective interconnect pad 502, but is not located below the interconnect pad 502. In yet another embodiment, the fuses 208, 320 may be formed within a layer of the plurality of interconnect layers 400.

Currently known electroplating processes use a large number of steps that are not required in the methods and structures disclosed herein. For example, with currently known methods, the steps include fabricating a wafer, applying an electroplating buss, applying photoresist, exposing and developing the elements to be electroplated, electroplating the elements, stripping the photoresist, removing the plating buss, testing electrical connections and functionality of the wafer, and singulating the IC die.

In contrast, embodiments of the electroplating process for the present disclosure include fabricating the wafer with fuses 208, 320 coupled to seal rings 202, electroplating the exposed elements, applying current to blow fuses 208, 320 coupled to an electroplated element, testing electrical connections and functionality of the IC die on the wafer and singulating the wafer into individual IC die. Embodiments of the novel fused electroplating buss structure can be fabricated using the same processes as required to create active circuitry and seal rings 202 currently being performed and requires no additional area on the IC die. The novel process of blowing the fuses after interconnect pads 502 are electroplated disconnects active circuitry and interconnect pads 502 from the seal rings 202. Thus embodiments of structures and methods disclosed herein provide the advantages of electroplating while eliminating most of the process steps and cost associated with electroplating.

Accordingly, in some embodiments, as shown in FIGS. 1-13 and described herein, a method for forming a semiconductor structure comprises forming a plurality of fuses 208 over a semiconductor substrate; forming a plurality of interconnect layers 400-408 over the semiconductor substrate and a plurality of interconnect pads 502 over the plurality of interconnect layers. A seal ring 202 is formed around active circuitry formed in and on the semiconductor substrate 302, interconnect pads 502, and fuses 208, 320. Each fuse 208, 320 is electrically connected to a corresponding interconnect pad 502 and the seal ring 202. When each fuse 208 is in a conductive state, the fuse 208 electrically connects the corresponding interconnect pad 502 to the seal ring 202.

In another aspect, while each fuse 208 is in the conductive state, current is provided through the seal rings 202 and through each of the fuses 208 to each of the interconnect pads 502 to electroplate a conductive layer 602 on each of the interconnect pads 502.

In a further aspect, after the step of providing current to electroplate the conductive layer 602, current is provided through at least a subset of the interconnect pads 502 to change a state of the fuses 208 electrically connected to the subset of the interconnect pads 502 to a non-conductive state.

In a further aspect, currents are sequentially applied through different subsets of the interconnect pads 502 to change a state of the fuses 208 electrically connected to the different subsets of the interconnect pads 502 to a non-conductive state until each fuse 208 is in a non-conductive state.

In a further aspect, the interconnect pads 502, fuses 208, and the seal ring 202 are formed within a first die 102 of a semiconductor wafer. A second plurality of fuses 320 are formed. A second plurality of interconnect pads 502 are formed at the top surface of the interconnect layers 400-408. A second seal ring 202 is formed that surrounds second active circuitry formed in and on the semiconductor substrate 302, the second interconnect pads 502, and the second fuses 320. Each fuse 320 is electrically connected to a corresponding interconnect pad 502 and the second seal ring 202. Each of the second fuses 320 is in a conductive state. The fuse 320 electrically connects the corresponding interconnect pad 502 of the second interconnect pads 502 to the second seal ring 202. The second interconnect pads 502, the second fuses 320, and the second seal ring 202 are formed within a second die 102 of the semiconductor wafer adjacent the first die 102.

In a further aspect, a seal ring interconnect 214 is formed which electrically connects the first seal ring 202 to the second seal ring 202. The seal ring interconnect 214 is formed in a scribe street 206 between the first and second die 102.

In a further aspect, while each fuse 208 and the second fuses 320 are in the conductive state, current is provided through the seal ring 202, the second seal ring 202, each of the fuses 208, and each of the second fuses 320 to each of the interconnect pads 502 and each of the second interconnect pads 502 to electroplate a conductive layer 602 on each of the interconnect pads 502 and the second interconnect pads 502.

In a further aspect, after forming the conductive layer 602 on each of the interconnect pads 502 and each of the second interconnect pads 502, a state of each fuse 208 and second fuses 320 is changed to a non-conductive state.

In a further aspect, the step of changing the state of each fuse 208 and second fuses 320 to the non-conductive state comprises sequentially applying currents to subsets of each of the first and second interconnect pads 502.

In a further aspect, after the step of changing the state of each fuse 208 and second fuses 320 to the non-conductive state, the first and second die 102 are tested and singulated.

In another embodiment, as shown in FIGS. 1-13 and described herein, a method for forming a semiconductor structure comprises forming a gate electrode 304 and a fuse 208 over a semiconductor substrate 302; forming a dielectric layer 314 over the gate electrode 304 and the fuse 208; in the dielectric layer 314, forming a first portion of a seal ring 202, a contact 306 to the gate electrode 304, a first contact 308 to a first end or terminal of the fuse 208, and a second contact 310 to a second end or terminal of the fuse 208; forming interconnect layers 400-408 over the dielectric layer 314, wherein forming the interconnect layers 400-408 comprises forming a second portion of the seal rings 202 which contiguously extends through the interconnect layers 400-408 and is connected to the first portion of the seal ring 202, wherein the seal ring 202 is connected to the second contact 310 through at least one interconnect layer of the interconnect layers 400-408; and forming an interconnect pad 502 over the interconnect layers 400-408, wherein the interconnect pad 502 is connected to the first contact 308 through the interconnect layers 400-408.

In another aspect, while the fuse 208 is in a conductive state, current is provided through the seal ring 202, through the second contact 310, through the fuse 208, through the first contact 308, and through the interconnect layers 400-408 to the interconnect pad 502 to electroplate a conductive layer 602 on the interconnect pad 502.

In a further aspect, after the step of providing the current to electroplate the conductive layer 602 on the interconnect pad 502, the state of the fuse 208 is changed from the conductive state to a non-conductive state.

In a further aspect, the step of changing the state of the fuse 208 comprises: providing a current through the electroplated conductive layer 602 and the interconnect pad 502 to the fuse 208 to change the state to the non-conductive state.

In a further aspect, the step of forming the gate electrode 304 and the fuse 208 over the semiconductor substrate 302 comprises forming a second conductive layer over the semiconductor substrate 302; and patterning the second conductive layer to form both the gate electrode 304 and the fuse 208 from the second conductive layer.

In a further aspect, the fuse 208 is further characterized as a polysilicon fuse 208.

In a further aspect, the gate electrode 304, the fuse 208, the interconnect pad 502, and the seal ring 202 are within a first die 102, and the step of forming the gate electrode 304 and the fuse 208 comprises forming a second fuse 320 over the semiconductor substrate in a second die 102, adjacent the first die 102, wherein the dielectric layer 314 is formed over the second fuse 320. The step of forming the first portion of the seal ring 202, the contact 306 to the gate electrode 304, the first contact 308 to the first end or terminal of the fuse 208, and the second contact 310 to the second end or terminal of the fuse 208 comprises, in the dielectric layer 314, forming a first portion of a second seal ring 202, a first contact 308 to a first end or terminal of the second fuse 320, and a second contact 318 to a second end or terminal of the second fuse 320. The step of forming the interconnect layers 400-408 comprises forming a second portion of the second seal ring 202 which contiguously extends through the interconnect layers 400-408 and is connected to the first portion of the second seal ring 202, wherein the second seal ring 202 is connected to the second contact 318 to the second end or terminal of the second fuse 320 through at least one interconnect layer of the interconnect layers 400-408. The step of forming the interconnect pad 502 comprises forming a second interconnect pad 502 over the interconnect layers 400-408, wherein the second interconnect pad 502 is connected to the first contact of the first end or terminal of the second fuse 320 through the interconnect layers 400-408, and wherein the second fuse 320, the second interconnect pad 502, and the second seal ring 202 are within the second die 102.

In a further aspect, the step of forming the interconnect layers 400-408 is performed such that the seal ring 202 is connected to the second seal ring 202 through at least one interconnect layer of the interconnect layers 400-408 in a scribe street 206 between the first and second die 102.

In a further aspect, while the fuse 208 and the second fuse 320 are in conductive states, providing current through the seal ring 202, through the fuse 208, and through the interconnect layers 400-408 to the interconnect pad 502 and through the second seal ring 202, through the second fuse 320, and through the interconnect layers 400-408 to the second interconnect pad 502 to electroplate a conductive layer 602 on the interconnect pad 502 and the second interconnect pad 502. After the step of providing the current to electroplate the conductive layer 602 on the interconnect pad 502 and the second interconnect pad 502, changing a state of each of the fuse 208 and the second fuse 320 from the conductive state to a non-conductive state.

In still another embodiment, as shown in FIGS. 1-13 and described herein, a method for forming a semiconductor structure, comprises forming a plurality of fuses 208 on a semiconductor substrate 302; forming a plurality of interconnect layers 400-408 over the semiconductor substrate 302 and the fuses 208; forming a plurality of interconnect pads 502 at a top surface of the interconnect layers 400-408; forming a seal ring 202, wherein the seal ring 202 surrounds active circuitry formed in and on the semiconductor substrate 302, the interconnect pads 502, and the fuses 208, wherein each fuse 208 is coupled between a corresponding interconnect pad 502 of the interconnect pads 502 and the seal ring 202, and wherein when each fuse 208 is in a conductive state, the fuse 208 electrically connects the corresponding interconnect pad 502 to the seal ring. While each fuse 208 is in the conductive state, providing current through the seal ring 202 and through each of the fuses 208 to each of the interconnect pads 502 to electroplate a conductive layer 602 on each of the interconnect pads 502. After the step of providing current to electroplate the conductive layer 602, changing a state of each of the fuses 208 from the conductive state to a non-conductive state.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, polysilicon fuses may be coupled between a seal ring and bumps to serve as electroplating busses for flipchip semiconductor devices. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor structure, comprising:

forming a plurality of fuses over a semiconductor substrate;

forming a plurality of interconnect layers over the semiconductor substrate and a plurality of interconnect pads at a top surface of the plurality of interconnect layers; and forming a seal ring, wherein the seal ring surrounds active circuitry formed in and on the semiconductor substrate, the plurality of interconnect pads, and the plurality of fuses, wherein each fuse of the plurality of fuses is electrically connected to a corresponding interconnect pad of the plurality of interconnect pads and the seal ring, and wherein when each fuse of the plurality of fuses is in a conductive state, the fuse electrically connects the corresponding interconnect pad to the seal ring.

2. The method of claim 1, further comprising:
while each fuse of the plurality of fuses is in the conductive state, providing current through the seal ring and through each of the plurality of fuses to each of the plurality of interconnect pads to electroplate a conductive layer on each of the plurality of interconnect pads.

3. The method of claim 2, further comprising:
after the step of providing current to electroplate the conductive layer, providing current through at least a subset of the plurality of interconnect pads to change a state of the fuses electrically connected to the subset of the plurality of interconnect pads to a non-conductive state.

4. The method of claim 3, further comprising:
sequentially applying currents through different subsets of the plurality of interconnect pads to change a state of the fuses electrically connected to the different subsets of the plurality of interconnect pads to a non-conductive state until each fuse of the plurality of fuses is in a non-conductive state.

5. The method of claim 1, wherein the plurality of interconnect pads, plurality of fuses, and the seal ring are formed within a first die of a semiconductor wafer, the method further comprising:
forming a second plurality of fuses;
forming a second plurality of interconnect pads at the top surface of the plurality of interconnect layers; and
forming a second seal ring, wherein the second seal ring surrounds second active circuitry formed in and on the semiconductor substrate, the second plurality of interconnect pads, and the second plurality of fuses, wherein each fuse of the second plurality of fuses is electrically connected to a corresponding interconnect pad of the second plurality of interconnect pads and the second seal ring, wherein when each fuse of the second plurality of fuses is in a conductive state, the fuse electrically connects the corresponding interconnect pad of the second plurality of interconnect pads to the second seal ring, and wherein the second plurality of interconnect pads, the second plurality of fuses, and the second seal ring are formed within a second die of the semiconductor wafer adjacent the first die.

6. The method of claim 5, further comprising:
forming a seal ring interconnect which electrically connects the first seal ring to the second seal ring, wherein the seal ring interconnect is formed in a scribe street between the first and second die.

7. The method of claim 6, further comprising:
while each fuse of the plurality of fuses and the second plurality of fuses is in the conductive state, providing current through the seal ring, the second seal ring, each of the plurality of fuses, and each of the second plurality of fuses to each of the plurality of interconnect pads and each of the second plurality of interconnect pads to electroplate a conductive layer on each interconnect pad of the plurality of interconnect pads and second plurality of interconnect pads.

8. The method of claim 7, further comprising:
after forming the conductive layer on each interconnect pad of the plurality of interconnect pads and second plurality of interconnect pads, changing a state of each fuse of the plurality of fuses and second plurality of fuses to a non-conductive state.

9. The method of claim 8, wherein the step of changing the state of each fuse of the plurality of fuses and second plurality of fuses to the non-conductive state comprises:
sequentially applying currents to subsets of each of the plurality of interconnect pads and second plurality of interconnect pads.

10. The method of claim 9, further comprising:
after the step of changing the state of each fuse of the plurality of fuses and the second plurality of fuses to the non-conductive state, singulating the first and second die.

11. A method for forming a semiconductor structure, comprising:
forming a plurality of fuses on a semiconductor substrate;
forming a plurality of interconnect layers over the semiconductor substrate and the plurality of fuses;
forming a plurality of interconnect pads at a top surface of the plurality of interconnect layers;
forming a seal ring, wherein the seal ring surrounds active circuitry formed in and on the semiconductor substrate, the plurality of interconnect pads, and the plurality of fuses, wherein each fuse of the plurality of fuses is coupled between a corresponding interconnect pad of the plurality of interconnect pads and the seal ring, and wherein when each fuse of the plurality of fuses is in a conductive state, the fuse electrically connects the corresponding interconnect pad to the seal ring;
while each fuse of the plurality of fuses is in the conductive state, providing current through the seal ring and through each of the plurality of fuses to each of the plurality of interconnect pads to electroplate a conductive layer on each of the plurality of interconnect pads; and
after the step of providing current to electroplate the conductive layer, changing a state of each of the fuses from the conductive state to a non-conductive state.

* * * * *